United States Patent
Chan et al.

(10) Patent No.: US 11,600,346 B2
(45) Date of Patent: Mar. 7, 2023

(54) NON-VOLATILE MEMORY AND WRITE CYCLE RECORDING DEVICE THEREOF

(71) Applicant: Winbond Electronics Corp., Taichung (TW)

(72) Inventors: Johnny Chan, Fremont, CA (US); Chi-Shun Lin, Fremont, CA (US)

(73) Assignee: Winbond Electronics Corp., Taichung (TW)

(*) Notice: Subject to any disclaimer, the term of this patent is extended or adjusted under 35 U.S.C. 154(b) by 40 days.

(21) Appl. No.: 17/338,638

(22) Filed: Jun. 3, 2021

(65) Prior Publication Data

US 2022/0392557 A1 Dec. 8, 2022

(51) Int. Cl.
| | |
|---|---|
| *G11C 16/10* | (2006.01) |
| *G11C 16/34* | (2006.01) |
| *G11C 16/26* | (2006.01) |
| *G11C 16/16* | (2006.01) |

(52) U.S. Cl.
CPC ........ *G11C 16/3495* (2013.01); *G11C 16/102* (2013.01); *G11C 16/16* (2013.01); *G11C 16/26* (2013.01); *G11C 16/3445* (2013.01); *G11C 16/3459* (2013.01)

(58) Field of Classification Search
CPC ............. G11C 16/3495; G11C 16/102; G11C 16/16; G11C 16/26; G11C 16/3445; G11C 16/3459
See application file for complete search history.

(56) References Cited

U.S. PATENT DOCUMENTS

| | | | |
|---|---|---|---|
| 8,566,506 B2 | 10/2013 | Locasio et al. | |
| 2011/0197045 A1* | 8/2011 | Okamoto | ............. G06F 11/327 |
| | | | 711/E12.084 |

FOREIGN PATENT DOCUMENTS

| | | |
|---|---|---|
| CN | 101211314 | 7/2008 |
| TW | 201734805 | 10/2017 |

\* cited by examiner

*Primary Examiner* — Xiaochun L Chen
(74) *Attorney, Agent, or Firm* — JCIPRNET

(57) ABSTRACT

A write cycle recording device includes a storage device and a controller. The storage device is corresponding to a memory block of a non-volatile memory. The storage device has a plurality of bits for recording a plurality of recorded writing loop counts corresponding to a plurality of writing operations of the memory block. The controller is configured to: perform a writing operation on the memory block; record a performed writing loop count of the writing operation; and, update a recorded writing loop count corresponding to the writing operation in the storage device according to the performed writing loop count.

18 Claims, 6 Drawing Sheets

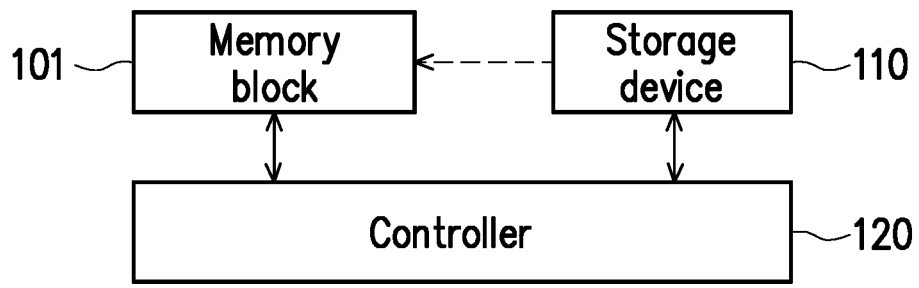
FIG. 1
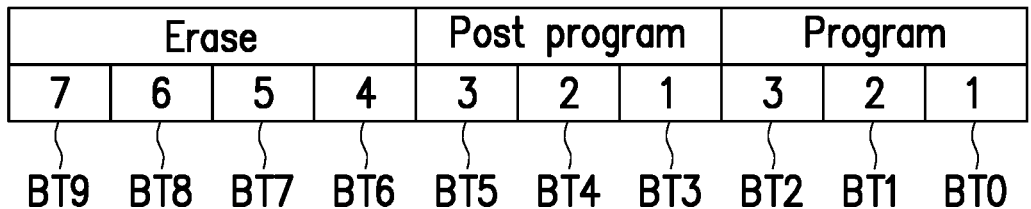
FIG. 2
| IDX | Recorded writing loop count |
|---|---|
| 0 | 2 |
| 1 | 4 |
| 2 | 8 |
| 3 | 16 |
| 4 | 32 |
| 5 | 64 |
| 6 | 128 |
| 7 | 256 |
| 8 | 512 |
FIG. 3

| Reg | Recorded writing loop count | | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|---|
| 0 | 2 | small pulse loops (1ms) | 0 | 1 | 1 | 1 | 0 | 1 | 0 | 1 | 0 | 1 | 1 | 1 | 0 | 1 | 0 | 1 | 0 | 1 | 0 | 1 | 0 | 1 | 0 | 1 | 0 | 1 | 1 | 1 | 0 | 1 | 0 | 1 |
| 1 | 4 | | 0 | 1 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 |
| 2 | 8 | | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 |
| 3 | 16 | | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 4 | 32 | | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 5 | 64 | one big pulse (write) | | | | | | | | | | | | | | | | | | | | | | | | | | | | | | | | |
| 6 | 128 | | | | | | | | | | | | | | | | | | | | | | | | | | | | | | | | | |
| 7 | 256 | | | | | | | | | | | | | | | | | | | | | | | | | | | | | | | | | |
| 8 | 512 | | | | | | | | | | | | | | | | | | | | | | | | | | | | | | | | | |
| | | one pulse width (ms) | 0 | 32 | 64 | 96 | 128 | 160 | 192 | 224 | 256 | 288 | 320 | 352 | 384 | 416 | 448 | 480 | 512 | 544 | 576 | 608 | 640 | 672 | 704 | 736 | 768 | 800 | 832 | 864 | 896 | 928 | 960 | 992 |
| | | bias (level) | 1 | 2 | 2 | 2 | 3 | 3 | 3 | 3 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |

FIG. 6

NON-VOLATILE MEMORY AND WRITE CYCLE RECORDING DEVICE THEREOF

BACKGROUND OF THE INVENTION

1. Field of the Invention

The invention relates to a non-volatile memory and a write cycle recording device thereof, and more particularly, to the write cycle recording device for improving a reliability of the non-volatile memory.

2. Description of Related Art

For a non-volatile memory, a writing loop count can always provide useful cycle information to improve reliability of non-volatile memory. In conventional art, the writing loop count always takes big circuit area to store and the stored writing loop count normally has reliability concern. That is, to provide a storage device with small circuit size which can provide the writing loop count with high reliability is an important course for a designer for the non-volatile memory.

SUMMARY OF THE INVENTION

The invention provides a non-volatile memory and a write cycle recording device thereof for improving an efficiency of writing operation to memory blocks.

The write cycle recording device includes a storage device and a controller. The storage device is corresponding to a memory block of a non-volatile memory. The storage device has a plurality of bits for recording a plurality of recorded writing loop counts corresponding to a plurality of writing operations of the memory block. The controller is configured to: perform a writing operation on the memory block; record a performed writing loop count of the writing operation; and, update a recorded writing loop count corresponding to the writing operation in the storage device according to the performed writing loop count.

The non-volatile memory includes at least one memory block, a storage device and a controller. Each of the at least one memory block has a plurality of memory blocks. The storage device is disposed in the at least one memory block ad corresponding to the at least one memory block of the non-volatile memory, wherein the storage device has a plurality of bits for recording a plurality of recorded writing loop counts corresponding to a plurality of writing operations of the memory block. The controller is coupled to the storage device and the memory block. The controller is configured to: perform a writing operation on the memory block; record a performed writing loop count of the writing operation; and, update a recorded writing loop count corresponding to the writing operation in the storage device according to the performed writing loop count.

Based on the above, the storage device records a plurality of recorded writing loop counts corresponding to a plurality of writing operations of the memory block. The controller can obtain a status for performing writing operation of a memory block, and can well define a characteristic of writing pulse for currently performed writing operation on the memory block according to the recorded writing loop counts. Such as that, an efficiency of the writing operation can be improved.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1 illustrates a schematic diagram of a write cycle recording device according to an embodiment of present disclosure.

FIG. 2 illustrates a schematic diagram of recorded information of the recorded writing loop count in the storage device according to an embodiment of present disclosure.

FIG. 3 illustrates a detail content of the recorded information in the storage device according to the embodiment in FIG. 2 of present disclosure.

FIG. 6 illustrates a schematic plot of a relationship between a recorded writing loop count and a two-mode writing operation scheme according to an embodiment of present disclosure.

DESCRIPTION OF THE EMBODIMENTS

Figure 4:
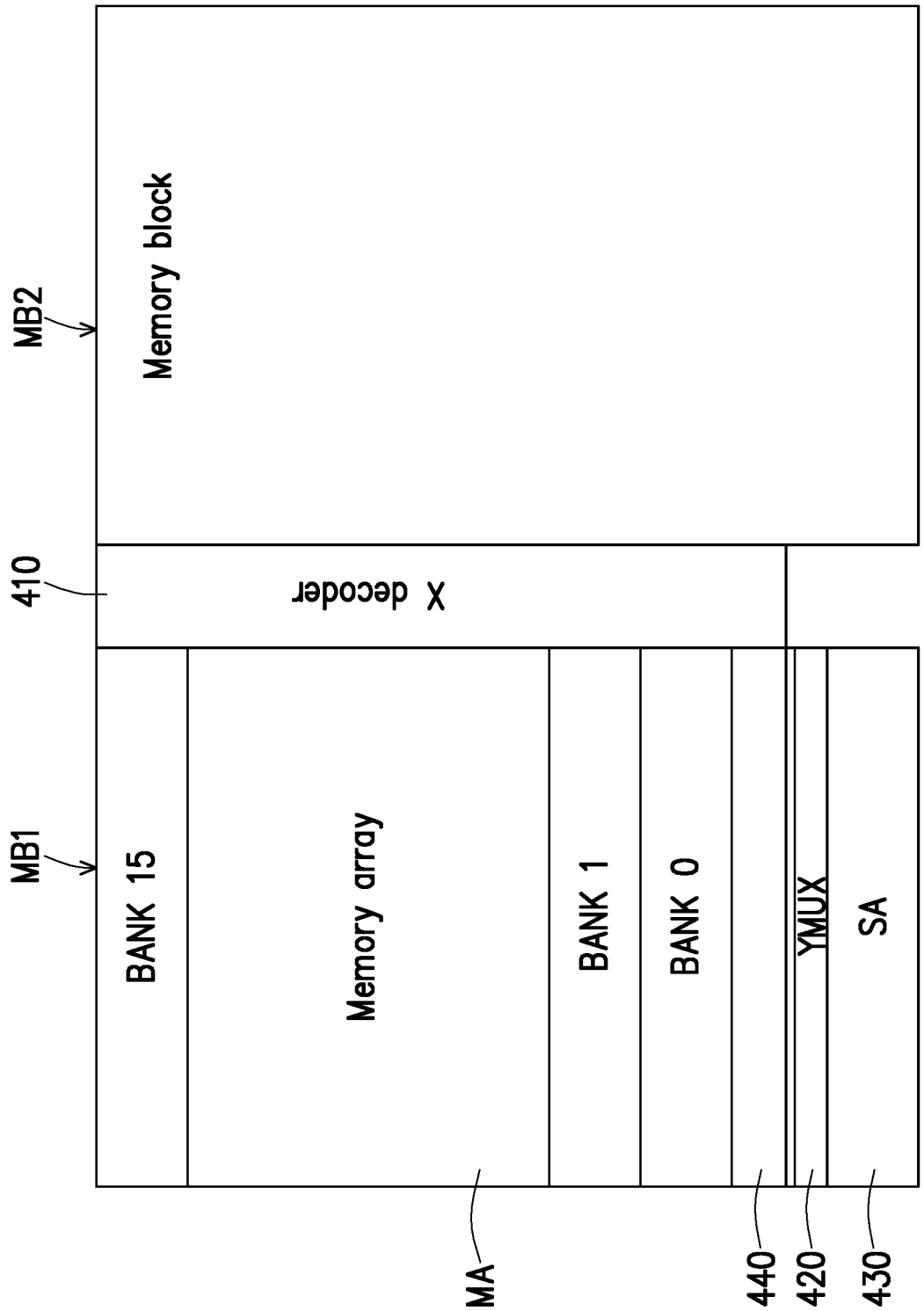
FIG. 4 illustrates a block diagram of a non-volatile memory according to an embodiment of present disclosure.

Reference will now be made in detail to the present preferred embodiments of the disclosure, examples of which are illustrated in the accompanying drawings. Wherever possible, the same reference numbers are used in the drawings and the description to refer to the same or like parts.

Please refer to FIG. 1, which illustrates a schematic diagram of a write cycle recording device according to an embodiment of present disclosure. The write cycle recording device 100 includes a storage device 110 and a controller 120. The storage device 110 is coupled to the controller 120. The storage device 110 corresponds to a memory block 101 of a non-volatile memory. In one embodiment, the storage device 110 can be set within the memory block 101, or in another embodiment, the storage device 110 can be set external from the memory block 101. The controller 120 is further coupled to the memory block 101. The non-volatile memory can be a flash memory.

The storage device 110 may have a plurality of bits. The bits of the storage device 110 is used for recording a plurality of recorded writing loop count corresponding to a plurality of writing operations of the memory block 101.

Please refer to FIG. 1 and FIG. 2 commonly, wherein FIG. 2 illustrates a schematic diagram of recorded information of the recorded writing loop count in the storage device according to an embodiment of present disclosure. In FIG. 2, the recorded information 200 has a plurality of bits BT0~BT9. The bits BT0~BT2 are used to store recorded writing loop count for a program operation of the corresponding memory block 101. The bits BT3~BT5 are used to store recorded writing loop count for a post-program operation of the corresponding memory block 101. The bits BT6~BT9 are used to store recorded writing loop count for an erase operation of the corresponding memory block 101.

Please also refer to FIG. 3, which illustrates a detail content of the recorded information in the storage device according to the embodiment in FIG. 2 of present disclosure. The recorded information can be presented by an index value IDX, and different index value IDX can correspond to different recorded writing loop count. In present disclosure, take the program operation as the writing operation for an example, if a maximum performed writing loop count on the memory block 101 is not larger than 2, the index value IDX can be set to 0; if the maximum performed writing loop count on the memory block 101 is larger than 2 and not larger than 4, the index value IDX can be set to 1; if the maximum performed writing loop count on the memory block 101 is larger than 4 and not larger than 8, the index value IDX can be set to 2; if the maximum performed writing loop count on the memory block 101 is larger than 8 and not larger than 16, the index value IDX can be set to 3; if the maximum performed writing loop count on the memory block 101 is larger than 16 and not larger than 32, the index value IDX can be set to 4; if the maximum performed writing loop count on the memory block 101 is larger than 32 and not larger than 64, the index value IDX can be set to 5; if the maximum performed writing loop count on the memory block 101 is larger than 64 and not larger than 128, the index value IDX can be set to 6; if the maximum performed writing loop count on the memory block 101 is larger than 128 and not larger than 256, the index value IDX can be set to 7; if the maximum performed writing loop count on the memory block 101 is larger than 256 and not larger than 512, the index value IDX can be set to 8.

It can be seen, if a maximum recorded writing loop count reaches to 512, a maximum value of the index value IDX can be set to 8, and there are 3 bits for recording the recorded writing loop count for the program operation is necessary. In fact, in present disclosure, a bit number of any one kind of the recorded writing loop count can be adjusted by a designer for necessary, and no more specific limitation here.

In additional, in present disclosure, the writing operations may further include a refresh operation.

Please refer to FIG. 1 again, the controller 120 is used to perform a writing operation on the memory block 101. Take the writing operation is the program operation for an example, the controller 120 may pre-read the storage device 11 to obtain the recorded writing loop count for the program operation. During the program operation, one or a plurality of writing pulses (program pulses) may be applied on the memory block 101, and the controller 120 may record a number of the writing pulses (program pulses) to obtain a performed writing loop count of the writing (program) operation. When the program operation is complete according to a program verify operation corresponding to the program operation, the controller 120 may obtain the performed writing loop count and compares the performed writing loop count with the recorded writing loop count. If the performed writing loop count is larger than the recorded writing loop count, the controller 120 can update the recorded writing loop count according to the performed writing loop count.

For example, if the index value IDX for the program operation is 2. The recorded writing loop count of the program operation corresponding to the memory block 101 is 8. If the controller 120 records the performed writing loop count is larger than 8 and not larger than 16, the controller 120 may updates the index value IDX for the program operation to 3.

It should be noted here, the recorded writing loop count in the storage device 110 can be used to show aging of the corresponding memory block 101. In detail, if a writing operation being performed on a young memory block 101, the controller 120 can perform one or more writing pulses with normal voltage value and normal pulse width. On the other hand, if the writing operation being performed on an elder memory block 101, the controller 120 can perform the writing pulses with higher voltage value and/or larger pulse width. The controller can adjust the voltage value and the pulse width can be adjusted by an amount of the recorded writing loop count.

Please refer to FIG. 4, which illustrates a block diagram of a non-volatile memory according to an embodiment of present disclosure. The non-volatile memory 400 includes a plurality of memory blocks MB1 and MB2. Take the memory block MB1 as an example. The memory block MB1 includes a plurality of memory banks BANK0~BANK15, a X decoder 410, a Y multiplexer (YMUX) 420, a sense amplifier (SA) 430 and a storage device 440. Each of the memory bank BANK0~BANK15 has a memory array MA with a plurality of memory cells. The X decoder 410 is an address decoder with a X direction, and can be shared by the memory block MB1 and the neighbor memory block MB2. The Y multiplexer 420 is another address decoder with a Y direction, wherein the X direction is different from the Y direction.

The sense amplifier 430 is coupled to the Y multiplexer 420 for receiving data from bit lines of selected memory bank according to the Y multiplexer 420. The sense amplifier 430 is used to sense out the data from the bit lines to obtain readout data from the selected memory bank.

It should be noted here, the storage device 440 can be set between the memory bank BANK0 and the Y multiplexer 420. The storage device 440 may be composed by a plurality of non-volatile memory cells (i.e. flash memory cells). The storage device 440 is used to record a plurality of recorded writing loop counts corresponding to a plurality of writing operations of the memory block MB1. Detail operation about the storage device 440 has been discussed in the embodiment mentioned above, and no more repeated description here.

Figure 5A:
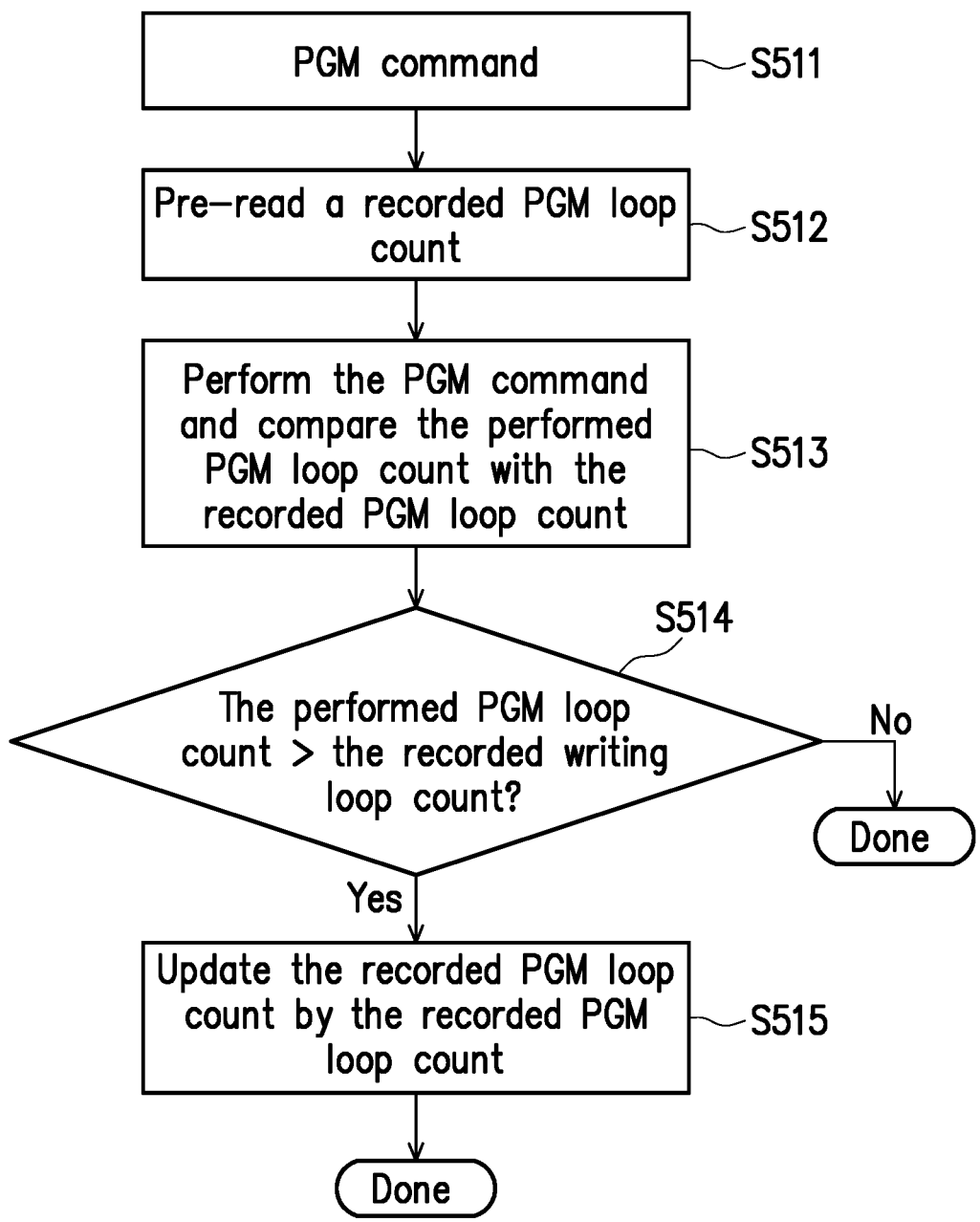
FIG. 5A and FIG. 5B respectively illustrate flow charts for different writing operations of a non-volatile memory according to an embodiment of present disclosure.
Figure 5B:
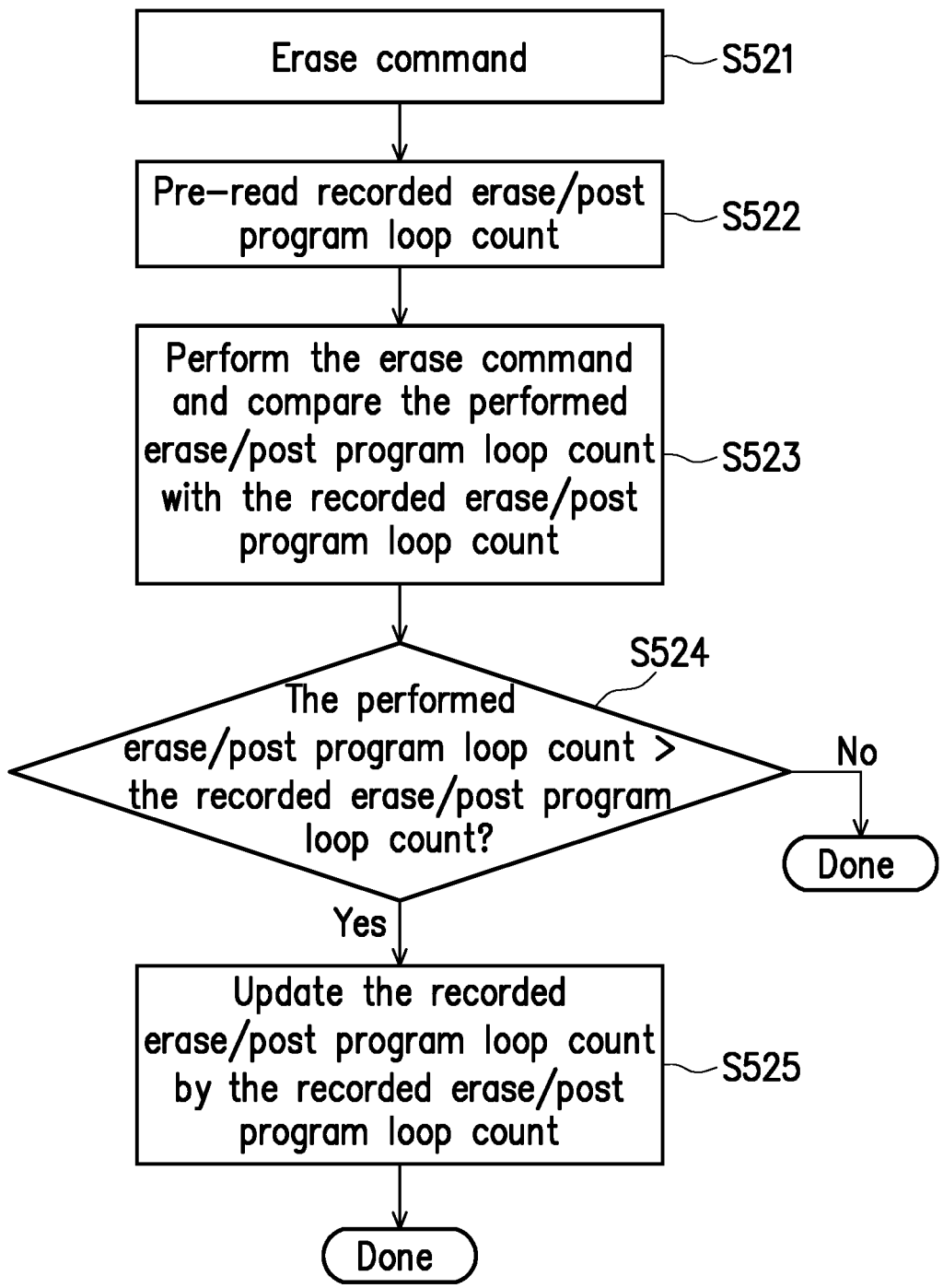

Please refer to FIG. 5A and FIG. 5B, wherein FIG. 5A and FIG. 5B respectively illustrate flow charts for different writing operations of a non-volatile memory according to an embodiment of present disclosure. In FIG. 5A, in a step S511, a program (PGM) is received by a controller of the non-volatile memory. In a step S512, the controller may pre-read a recorded PGM loop count from a storage device in the non-volatile memory. In a step S513, the controller performs a program operation according to the PGM command to apply at least one program pules on a memory block which is selected, and calculates a performed PGM loop count during the program operation. The controller further compares the performed PGM loop count with the recorded PGM loop count in the step S513.

In a step S514, the controller judges whether the performed PGM loop count is larger than the recorded PGM loop count or not. In the step S514, if the performed PGM loop count is not larger than the recorded PGM loop count, the program operation can be done. On the contrary, if the performed PGM loop count is larger than the recorded PGM loop count, the controller updates the recorded PGM loop count by the performed PGM loop count in a step S515, and the program operation can be done. In the embodiment, the performed PGM loop count is a maximum performed PGM loop count during the program operation before a program verify successful is determined.

In FIG. 5B, in a step S521, an erase is received by a controller of the non-volatile memory. In a step S522, the controller may pre-read a recorded erase loop count from a storage device in the non-volatile memory. In a step S523, the controller performs an erase/post-program operation according to the erase command to apply at least one erase pules on a memory block which is selected, and then apply at least one post-program pules on the memory block if necessary. The controller further calculates a performed erase loop count and a performed post-program loop count during the erase operation. The controller further compares the performed erase/post program loop count with the recorded erase/post-program loop count in the step S523.

In a step S524, the controller judges whether the performed erase/post-program loop count is larger than the recorded erase/post-program loop count or not. In the step S524, if the performed erase/post-program loop count is not larger than the recorded erase/post-program loop count, the erase operation can be done. On the contrary, if the performed erase/post-program loop count is larger than the recorded erase/post-program loop count, the controller updates the recorded erase/post-program loop count by the performed erase/post-program loop count in a step S525, and the erase operation can be done. In the embodiment, the performed erase/post-program loop count is a maximum performed erase/post-program loop count during the erase operation before an erase verify successful is determined.

Please refer to FIG. 6, which illustrates a schematic plot of a relationship between a recorded writing loop count and a two-mode writing operation scheme according to an embodiment of present disclosure. The two-mode writing operation scheme can be performed by the hardware structure of the write cycle recording device 100 in FIG. 1. In this embodiment, the storage device 110 may store a plurality of look up sets (for example, 31 sets). Each of the look up set is used to correspond to a pulse width and a bias level of a one big pulse writing in a second mode for writing operation. In FIG. 6, the look up set 0 is not necessary to record in the storage device 110.

About detail of the look up set, the look up set 1 has digital values 1 0 0 0 0, and correspond to recorded writing loop count=32. The look up set 2 has digital values 0 1 0 0 0, and correspond to recorded writing loop count=64. The look up set 3 has digital values 1 1 0 0 0, and correspond to recorded writing loop count=32+64=96. And so on, according to the recorded writing loop count, one of the look up sets can be selected to be a selected look up set when the recorded writing loop count is equal or larger than 32.

If the recorded writing loop count is smaller than a threshold value (=32), the controller can perform the writing operation on the memory block 101 by a first mode. In the first mode, the controller 120 can perform the writing operation by applying a plurality of writing pulses with a same voltage and a same pulse width to the memory block 101 which is selected.

If the recorded writing loop count is not smaller than 32, the controller 120 can select one of the look up sets to be the selected look up set according to the recorded writing loop count read from the storage device 110. For example, if the recorded writing loop count equals 192, the look up set 6 (shown as a field 610) can be selected to be the selected to be the selected look up set by the controller 120.

By looking up the field 610, a one pulse width of a writing operation can be set to 192 ms, for example. A bias level for a first writing pulse also can be set to level 3 accordingly. Such as that, the controller 120 can perform the writing operation on the memory block 101 which is selected by a second mode, and firstly apply the first writing pulse with the first bias level (=3) and the first pulse width equal to 192 ms. The controller 120 then applies a plurality of second writing pulses with a second bias level and a second pulse width to the memory block 101. In here, the second bias level (may equal to 1) is smaller than the first bias level, and the second pulse width is smaller than the first pulse width. In some embodiment, the second bias level may be equal to the bias level of the writing pulses in the first mode, and the second pulse width be equal to the pulse width of each of the writing pulses in the first mode.

Besides, the recorded writing loop count can be recorded by a register Reg. The register Reg may have a plurality of bits, such as 9 bits as shown in FIG. 6. The bits 0 to 9 of the register Reg may respectively correspond to number 2, 4, 8, 16, 32, 64, 128, 256 and 512. For one example, if the recorded writing loop count equals 22, the bits 0, 1, 3 of the register Reg may be set to "1", and other bits of the register Reg may be set to "0". For another example, if the recorded writing loop count equals 162, the bits 0, 4, 6 of the register Reg may be set to "1", and other bits of the register Reg may be set to "0". And so on, the recorded writing loop count can be well recorded by the register Reg.

In this embodiment, the look up sets 1~31 and the corresponding one pulse widths and the bias levels can be also recorded in the storage device 110. Values of the one pulse widths and the bias levels can be adjusted dynamically by the controller 120 if necessary.

Figure 7:
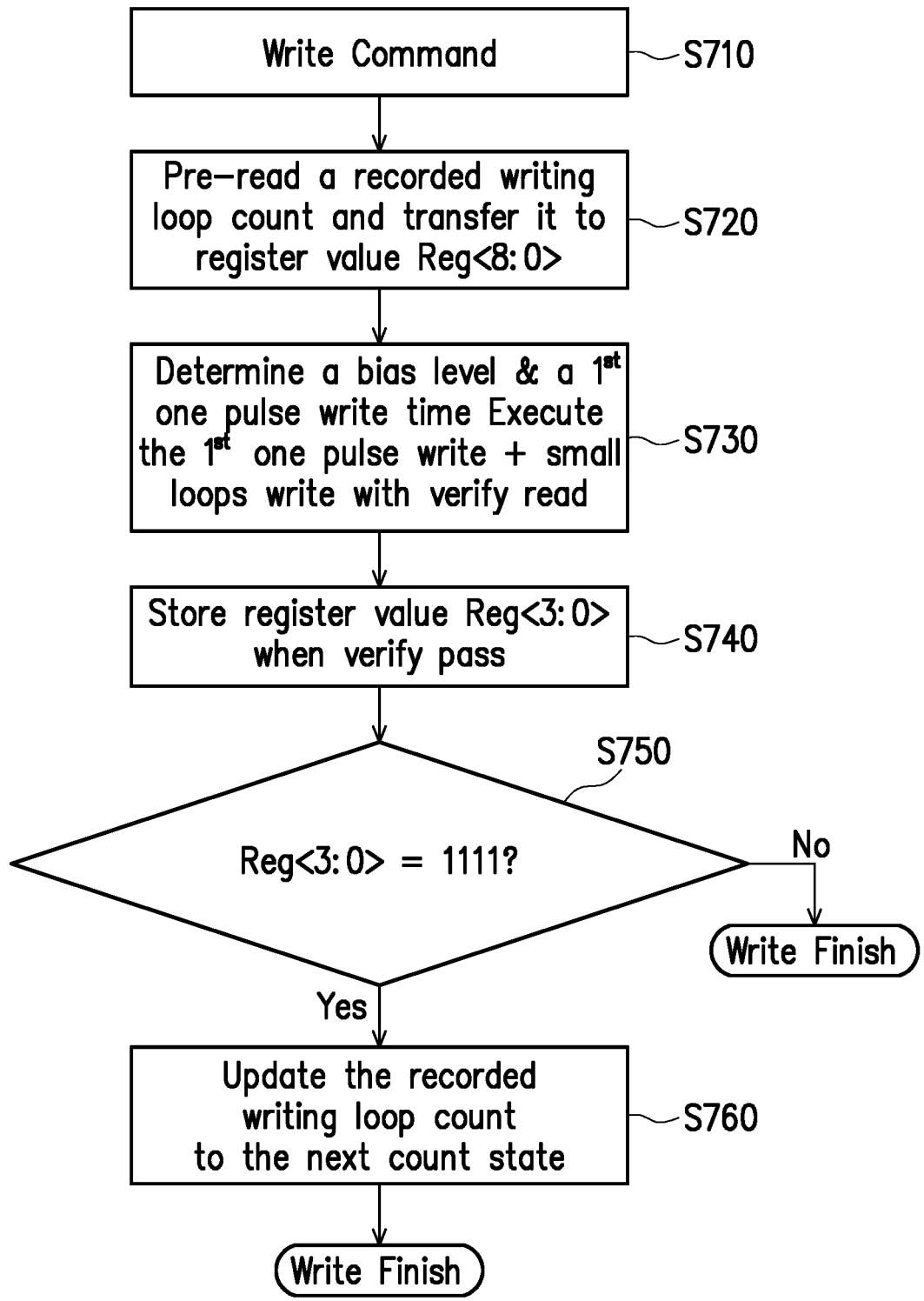
FIG. 7 illustrates a flow char of a writing operation for a non-volatile memory according an embodiment of present disclosure.

Please refer to FIG. 7 and FIG. 6 commonly, wherein FIG. 7 illustrates a flow char of a writing operation for a non-volatile memory according an embodiment of present disclosure. In a step S710, a write command is received by a controller of the non-volatile memory. In a step S720, the controller pre-reads a recorded writing loop count which is stored in a storage device, and the controller transfers the recorded writing loop count to a register value Reg<8:0>.

The controller further determines a bias level and a $1^{st}$ one pulse write time and firstly executes a $1^{st}$ one pulse write and then a plurality of small loops write with verify read in a step S730. In here, the step S730 is executed when the writing operation should be performed in the second mode. The controller can determine to perform the writing operation in the second mode according to the register value Reg<8:0>.

In a step S740, the controller can store a part of the register value Reg<3:0> when the verify read is pass. The controller compares the part of the register value Reg<3:0> with a pre-define number (for example binary code 1111) in a step S750. If the part of the register value Reg<3:0> isn't equal to the pre-define number, the writing operation can be finished. If the part of the register value Reg<3:0> is equal to the pre-define number, the controller can update the recorder writing loop count to a next count state in a step S760, and the writing operation can be finished.

In summary, the present disclosure provides a storage device to store a recorded writing loop count corresponding to a memory block in a non-volatile memory. When a new writing operation is performed on the memory block, the controller can decide a better writing operation scheme according to the recorded writing loop count. An efficiency of the writing operation can be improved accordingly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A write cycle recording device, comprising:
a storage device, corresponding to a memory block of a non-volatile memory, wherein the storage device has a plurality of bits for recording a plurality of recorded writing loop counts corresponding to a plurality of writing operations of the memory block; and
a controller, coupled to the storage device and the memory block, being configured to:
perform a writing operation on the memory block;
record a performed writing loop count of the writing operation; and
update a recorded writing loop count corresponding to the writing operation in the storage device according to the performed writing loop count,
wherein during the writing operation being performed, the controller is configured to:
pre-read the storage device to obtain the recorded writing loop count for the writing operation;
obtain the performed writing loop count during the writing operation;
compare the first writing loop count with the performed writing loop count; and
update the bits in the storage device corresponding to the recorded writing loop count according to the performed writing loop count when the performed writing loop count is larger than the recorded writing loop count.

2. The write cycle recording device according to claim 1, wherein the writing operations comprise a program operation and an erase operation.

3. The write cycle recording device according to claim 2, wherein the writing operations further comprises a post program operation and a refresh operation.

4. The write cycle recording device according to claim 1, wherein the storage device stores a plurality of index values, and the plurality of index values respectively corresponding to the plurality of recorded writing loop counts.

5. The write cycle recording device according to claim 1, wherein the controller sets at least one of a bias level and a pulse width of a writing pulse for the writing operation according to the recorded writing loop count.

6. The write cycle recording device according to claim 1, wherein the controller is further configured to:
set a plurality of look up sets corresponding to the recorded writing loop count;
select one of the look up sets to be a selected look up set according to the recorded writing loop count;
obtain a one pulse width and a bias level according to the selected look up set,
wherein when the recorded writing loop count is smaller than a threshold value, perform the writing operation with a first mode, and when the recorded writing loop count is not smaller than the threshold value, the controller performs the writing operation with a second mode,
wherein the first mode is different from the second mode.

7. The write cycle recording device according to claim 6, wherein in the first mode, the controller performs the writing operation with the first mode by applying a plurality of writing pulses with a same bias level and a same pulse width.

8. The write cycle recording device according to claim 6, wherein in the second mode, the controller performs the writing operation with the second mode by applying a first writing pulse with a first bias level and a first pulse width to the memory block, and then applying a plurality of second writing pulses with a second bias level and a second pulse width to the memory block,
wherein the first voltage is larger than the second voltages, and the first pulse width is larger than the second pulse width.

9. The write cycle recording device according to claim 6, wherein the controller transfers the recorded writing loop count to a plurality of register values and adjusts the first bias level and the first pulse width according to register values.

10. The write cycle recording device according to claim 9, wherein the controller checks whether the register values reach to a pre-define number or not when a verify operation of the writing operation is passed, and the controller update the recorded writing loop count to a next count state when the register values reach to the pre-define number.

11. A non-volatile memory, comprising:
at least one memory block, wherein each of the at least one memory block has a plurality of memory banks;
a storage device, being disposed in the at least one memory block ad corresponding to the at least one memory block of the non-volatile memory, wherein the storage device has a plurality of bits for recording a plurality of recorded writing loop counts corresponding to a plurality of writing operations of the memory block; and
a controller, coupled to the storage device and the memory block, being configured to:
perform a writing operation on the memory block;
record a performed writing loop count of the writing operation; and
update a recorded writing loop count corresponding to the writing operation in the storage device according to the performed writing loop count,
wherein during the writing operation being performed, the controller is configured to:
pre-read the storage device to obtain the recorded writing loop count for the writing operation;
obtain the performed writing loop count during the writing operation;
compare the first writing loop count with the performed writing loop count; and
update the bits in the storage device corresponding to the recorded writing loop count according to the performed writing loop count when the performed writing loop count is larger than the recorded writing loop count.

12. The non-volatile memory, according to claim 11, wherein the writing operations comprise a program operation and an erase operation.

13. The non-volatile memory, according to claim 12, wherein the writing operations further comprise a post program operation and a refresh operation.

14. The non-volatile memory, according to claim 11, wherein the controller sets at least one of a bias level and a pulse width of a writing pulse for the writing operation according to the recorded first writing loop count.

15. The non-volatile memory, according to claim 11, wherein the controller is further configured to:
set a plurality of look up sets corresponding to the recorded writing loop count;
select one of the look up sets to be a selected look up set according to the recorded writing loop count;
obtain a one pulse width and a bias level according to the selected look up set, wherein when the recorded writing loop count is smaller than a threshold value, perform the writing operation with a first mode, and when the recorded writing loop count is not smaller than the threshold value, the controller performs the writing operation with a second mode, wherein the first mode is different from the second mode.

16. The non-volatile memory, according to claim 15, wherein in the first mode, the controller performs the writing operation with the first mode by applying a plurality of writing pulses with a same bias level and a same pulse width;

wherein in the second mode, the controller performs the writing operation with the second mode by applying a first writing pulse with a first bias level and a first pulse width to the memory block, and then applying a plurality of second writing pulses with a second bias level and a second pulse width to the memory block, wherein the first voltage is larger than the second voltages, and the first pulse width is larger than the second pulse width.

17. The non-volatile memory, according to claim 15, wherein the controller transfers the recorded writing loop count to a plurality of register values and adjusts the first bias level and the first pulse width according to the register values.

18. The non-volatile memory, according to claim 17, wherein the controller checks whether the register values reach to a pre-define number or not when a verify operation of the writing operation is passed, and the controller update the recorded writing loop count to a next count state when the register values reach to the pre-define number.

* * * * *